(12) United States Patent
Chawla et al.

(10) Patent No.: US 9,615,483 B2
(45) Date of Patent: Apr. 4, 2017

(54) TECHNIQUES AND CONFIGURATIONS ASSOCIATED WITH A PACKAGE LOAD ASSEMBLY

(71) Applicant: Intel Corporation, Santa Clara, CA (US)

(72) Inventors: Gaurav Chawla, Tempe, AZ (US); Joshua D. Heppner, Chandler, AZ (US); Vijaykumar Krithivasan, Chandler, AZ (US); Michael Garcia, Chandler, AZ (US); Kuang C. Liu, Queen Creek, AZ (US); Rajasekaran Swaminathan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 14/484,896

(22) Filed: Sep. 12, 2014

(65) Prior Publication Data

US 2016/0079150 A1    Mar. 17, 2016

(51) Int. Cl.
*H05K 7/20* (2006.01)
*H01L 23/367* (2006.01)
(Continued)

(52) U.S. Cl.
CPC ........... *H05K 7/20* (2013.01); *H01L 23/3675* (2013.01); *H01L 23/4006* (2013.01);
(Continued)

(58) Field of Classification Search
None
See application file for complete search history.

(56) References Cited

U.S. PATENT DOCUMENTS 6,075,702 A * 6/2000 Gardner ............... H05K 7/1431
165/185
6,205,026 B1 * 3/2001 Wong .................. H01L 23/4093
165/80.3
(Continued)

FOREIGN PATENT DOCUMENTS

JP    2005019692 A    1/2005

OTHER PUBLICATIONS

Search Report issued May 24, 2016 for Taiwan Application No. 104125802, 2 pages.

*Primary Examiner* — Courtney Smith
*Assistant Examiner* — Zhengfu Feng
(74) *Attorney, Agent, or Firm* — Schwabe, Williamson & Wyatt, P.C.

(57) ABSTRACT

Embodiments of the present disclosure are directed toward techniques and configurations associated with a package load assembly. In one embodiment, a package load assembly may include a frame configured to form a perimeter around a die area of a package substrate having a first surface configured to be coupled with a surface of the package substrate and a second surface disposed opposite to the first surface. The frame may include deformable members disposed on the second surface, which may be configured to be coupled with a base of a heat sink to distribute force applied between the heat sink and the package substrate, via the frame, and may deform under application of the force, which may allow the base of the heat sink to contact a surface of an integrated heat spreader within the die area of the package substrate.

21 Claims, 10 Drawing Sheets

(51) Int. Cl.
*H01L 23/40* (2006.01)
*H01L 23/433* (2006.01)

(52) U.S. Cl.
CPC .. *H01L 23/433* (2013.01); *H01L 2224/16225* (2013.01); *H01L 2924/0002* (2013.01); *H01L 2924/15311* (2013.01); *H01L 2924/16152* (2013.01)

(56) References Cited

U.S. PATENT DOCUMENTS

| | | | | |
|---|---|---|---|---|
| 6,278,615 | B1 * | 8/2001 | Brezina | H01L 23/433 174/51 |
| 6,362,977 | B1 * | 3/2002 | Tucker | H05K 9/0033 174/354 |
| 6,643,137 | B1 * | 11/2003 | Chung | H01L 23/367 165/185 |
| 6,683,796 | B2 * | 1/2004 | Radu | H05K 9/0016 361/709 |
| 7,327,577 | B2 * | 2/2008 | Gilliland | H01L 23/552 257/706 |
| 2002/0137369 | A1 | 9/2002 | Edwards et al. | |
| 2009/0325415 | A1 | 12/2009 | Brist et al. | |
| 2010/0018670 | A1 | 1/2010 | Azar et al. | |
| 2010/0072612 | A1 * | 3/2010 | Atkinson, Jr. | H01L 23/10 257/712 |
| 2010/0142153 | A1 * | 6/2010 | Ho | H01L 23/3677 361/710 |

* cited by examiner

TECHNIQUES AND CONFIGURATIONS ASSOCIATED WITH A PACKAGE LOAD ASSEMBLY

FIELD

Embodiments of the present disclosure generally relate to the field of integrated circuit packages, and more particularly, to techniques and configurations associated with a package load assembly.

BACKGROUND

In a typical server package, the integrated heat spreader (IHS) covers approximately the entire package substrate area to provide rigidity to the package substrate. A typical IHS may be expensive to manufacture, with the total cost of the IHS being at least in part dependent on the size of the IHS needed. In addition, because an IHS is not easily removable from the package substrate, an IHS may hinder the incorporation of additional components onto the package substrate that may need to be replaced occasionally, for example, as a result of maintenance or needed upgrades.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations associated with a package load assembly. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

Figure 1:
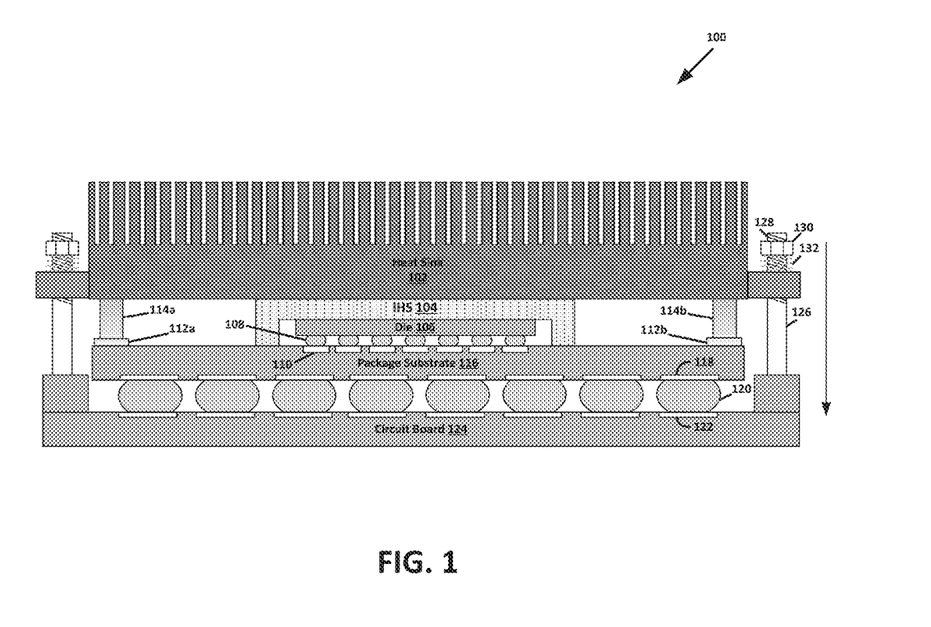
FIG. 1 schematically illustrates a cross-section side view of an example integrated circuit (IC) package assembly having a package load assembly, in accordance with various embodiments of the present disclosure.

FIG. 1 schematically illustrates a cross-section side view of an example integrated circuit (IC) assembly 100. In some embodiments, the IC assembly 100 may include one or more dies (e.g., die 106) electrically and/or physically coupled with a package substrate 116, as can be seen. The package substrate 116 may further be electrically coupled with a circuit board 124, as can be seen.

In embodiments, a surface of die 106 may be coupled with a first surface of an integrated heat spreader (IHS) (e.g., IHS 104). IHS 104 may in turn have a second surface coupled with a base surface of heat sink 102. IHS 104 and heat sink 102 may be configured to transfer thermal energy caused by the operation of die 106 away from die 106. In embodiments, a force, or load, may be applied from heat sink 102 to package substrate 116. Such a force may be, for example, the weight of heat sink 102. In embodiments, this force may be distributed to the package substrate in part by IHS 104 and in part by a package load assembly including two or more deformable members (e.g., deformable members 114a and 114b) disposed on two or more sides of a frame (e.g., frame sides 112a and 112b). In embodiments, the sides of the frame may form a perimeter around die 106 and IHS 104.

Deformable members 114a and 114b may be configured to deform under the force applied between heat sink 102 and package substrate 116. In embodiments, deformable members may be configured to deform to a point at which the base surface of heat sink 102 contacts the second surface of IHS 104. Deformable members 114a and 114b may relieve IHS 104 from distributing all of the force of heat sink 102 to package substrate 116. In some embodiments, the package load assembly may enable a size of IHS 104 to be reduced compared to an embodiment where such a package load assembly is not present. This reduction in size may reduce the cost of implementing IHS 104 in addition to opening up an area on package substrate 116 for the placement of additional modules, such as the on-package-component (OPC) modules discussed in reference to FIGS. 2-6. In addition, the deformability of deformable members 114a and 114b may be configured to account for any variances in manufacturing of package assembly 100 or any components thereof. Deformable members may be any type of member capable of deforming under application of a force. For example, deformable members 114a and 114b may be any type of spring. In addition, deformable members 114a and 114b may be comprised of any suitable material including any type of metal, plastic, etc.

Heat sink 102 and IHS 104 may include material selected based upon the material's thermal conductivity and may include any material, or combination of material, capable of allowing sufficient heat transfer away from die 106 to allow die 106 to maintain an operational temperature while voltage is applied. For example, the material may include copper or copper alloy, aluminum or aluminum alloy, AlSiC (aluminum matrix with silicon carbide particles), diamond, copper-tungsten pseudoalloy, Dymalloy.

Figure 5:
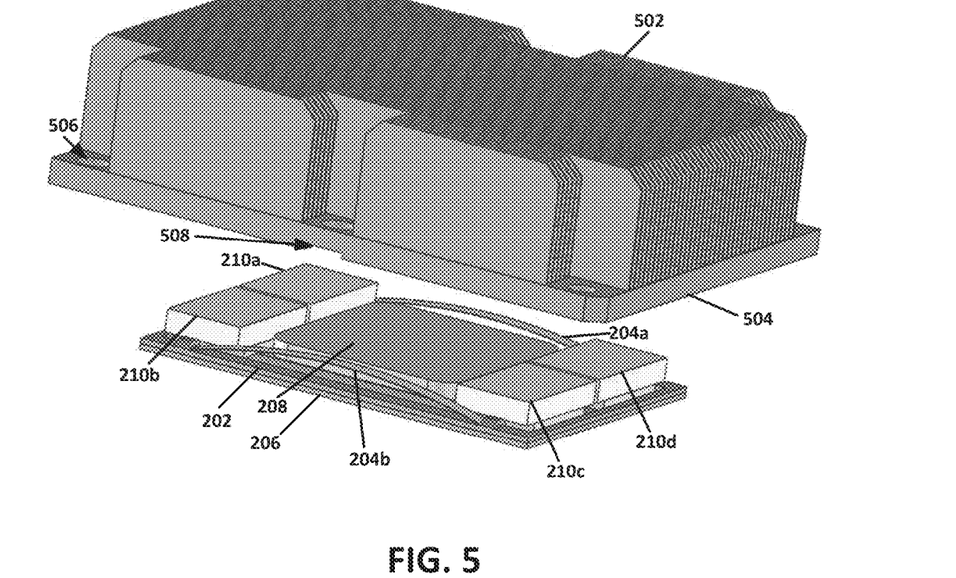
FIG. 5 is an exploded perspective view of an IC package coupled with a package load assembly and a heat sink, in accordance with various embodiments of the present disclosure.

In some embodiments, heat sink 102 may be configured with one or more alignment holes (e.g., alignment hole 506 of FIG. 5). In such embodiments, circuit board 124 may be configured with corresponding pins (e.g., pin 126) onto which the alignment holes may be disposed. Such pins may be utilized to position heat sink 102 onto the load frame. In addition, such pins may be configured with threads 128 to accept a threaded fastener 130 to secure heat sink 102 to circuit board 124. In some embodiments, fasteners 130 may be configured with a spring (e.g., spring 132) to allow for adjustment of the force applied between heat sink 102 and package substrate 116. This adjustment of force may enable heat sink 102 to fully contact a surface of IHS 104 in addition to providing sufficient force to maintain an electrical connection with circuit board 124. In particular, in some embodiments, package substrate 116 may be coupled with circuit board 124 by way of a socket disposed on circuit board 124 and interconnect pins disposed on package substrate 116. In such embodiments, a predetermined amount of force may be needed to maintain an electrical connection between the interconnect pins and the socket and this predetermined amount of force may be reached through adjustment of fasteners 130 that would then tighten or loosen spring 132.

Die 106 may be attached to package substrate 116 according to a variety of suitable configurations, including a flip-chip configuration, as depicted, or other configurations such as, for example, being embedded in the package substrate 116 or being configured in a wirebonding arrangement. In the flip-chip configuration, the die 106 may be attached to a surface of the package substrate 116 via die interconnect structures 108 such as bumps, pillars, or other suitable structures that may also electrically couple die 106 with the package substrate 116.

Die 106 may represent a discrete chip made from a semiconductor material and may be, include, or be a part of a processor, memory, or ASIC in some embodiments. In some embodiments, an electrically insulative material such as, for example, molding compound or underfill material (not pictured) may partially encapsulate a portion of die 106 and/or interconnect structures 108. Die interconnect structures 108 may be configured to route the electrical signals between die 106 and package substrate 116.

Package substrate 116 may include electrical routing features configured to route electrical signals to or from die 106. The electrical routing features may include, for example, traces disposed on one or more surfaces of package substrate 116 and/or internal routing features such as, for example, trenches, vias, or other interconnect structures to route electrical signals through package substrate 116. For example, in some embodiments, package substrate 116 may include electrical routing features (such as die bond pads 110) configured to receive the die interconnect structures 108 and route electrical signals between die 106 and package substrate 116. In some embodiments, the package substrate 116 is an epoxy-based laminate substrate having a core and/or build-up layers such as, for example, an Ajinomoto Build-up Film (ABF) substrate.

The circuit board 124 may be a printed circuit board (PCB) composed of an electrically insulative material such as an epoxy laminate. For example, the circuit board 116 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias, may be formed through the electrically insulating layers to route the electrical signals of the die 106 through the circuit board 124. The circuit board 124 may be composed of other suitable materials in other embodiments. In some embodiments, the circuit board 124 is a motherboard (e.g., motherboard 1102 of FIG. 11).

Package-level interconnects such as, for example, solder balls 120 or land-grid array (LGA) structures may be coupled to one or more lands (hereinafter "lands 118") on the package substrate 116 and one or more pads 122 on the circuit board 124 to form corresponding solder joints that are configured to further route the electrical signals between the package substrate 116 and the circuit board 124. Other suitable techniques to physically and/or electrically couple the package substrate 116 with the circuit board 124 may be used in other embodiments.

Figure 2:
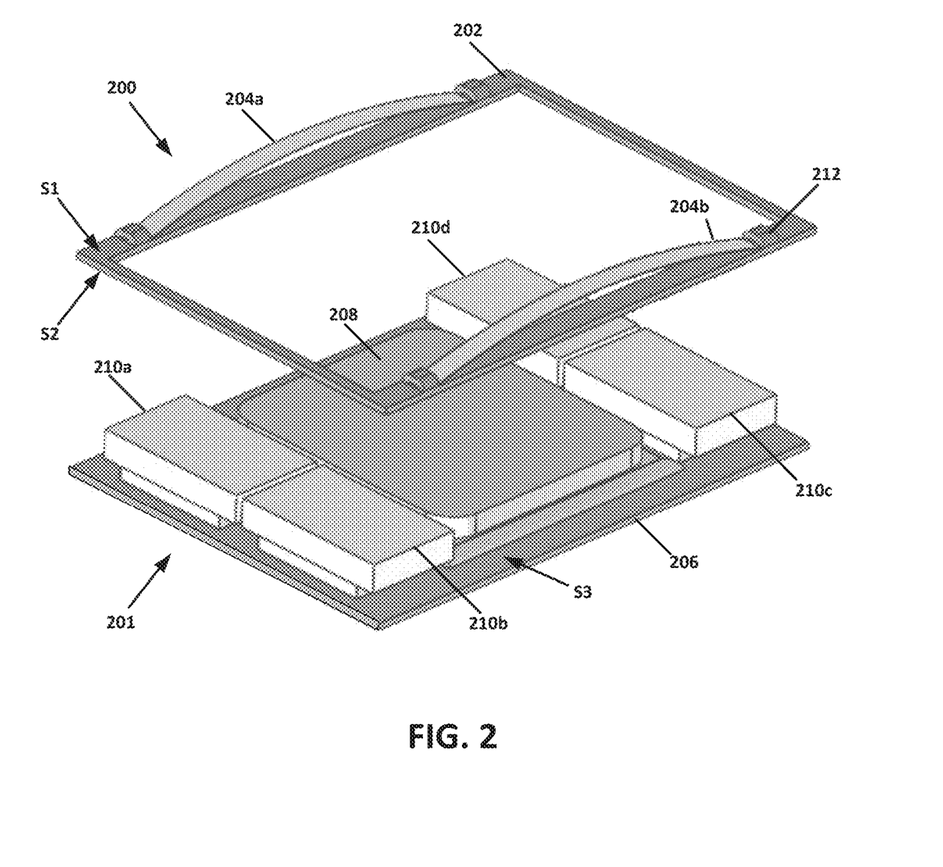
FIG. 2 is an exploded perspective view of an IC package with a package load assembly, in accordance with various embodiments of the present disclosure.

FIG. 2 is an exploded view of an IC package 201 with a package load assembly 200, in accordance with various embodiments of the present disclosure. Package load assembly 200 may include deformable members 204a and 204b disposed on a surface S1 of frame 202. In embodiments, deformable members 204a and 204b may be springs, specifically depicted here as leaf springs. Deformable members 204a and 204b may, in some embodiments, be incorporated with frame 202 as depicted in frames 702, 802, and 902 of FIGS. 7-9, respectively. In other embodiments, as depicted here, deformable members 204a and 204b may be configured to be detachable from frame 202. This may be accomplished by forming deformable members 204a and 204b with a tab on either end of each of the deformable members. The tab may be configured to engage a tab retention point of the frame (e.g., tab retention point 212) to hold deformable members 204a and 204b in place. In such embodiments, deformable members 204a and 204b may be configured to be attached to frame 202 by bending, or otherwise deforming, deformable members 204a and 204b to the point that the tabs on either end may be inserted into the tab retention points. Deformable members 204a and 204b may then be allowed to expand, causing the tabs on either end to engage the tab retention points. In such embodiments, deformable members 204a and 204b may be configured to be replaced with different deformable members for different applications or to enable replacement of a deformable member that has worn or broken while still utilizing the same frame. In embodiments, deformable members 204a and 204b may be configured to account for any variances in manufacturing of IC package 201 or any of the components thereof.

IC package 201 may include a package substrate 206. IC package 201 may also include one or more dies (e.g., die 402 of FIG. 4) coupled with a die attachment area of package substrate 206. Such a die attachment area is encompassed by integrated heat spreader (IHS) 208, which would be disposed over the one or more dies coupled with the die attachment area in a similar configuration to that depicted by IHS 104 of FIG. 1. IC package 201 may include one or more additional components coupled with package substrate 206. Such additional components may include on-package-component (OPC) modules 210a-210d which may include any additional components, or any combination of additional components. Such components may include one or more additional dies, additional memory modules, fabric chips, field programmable gate arrays (FPGAs), etc. In some embodiments, OPC modules 210a-210d may not be coupled with package substrate 206, but package substrate 206 may be configured with OPC keep out zones for later attachment of the OPC modules. While four OPC modules are depicted, 210a-210d, it will be appreciated that this is merely an illustrative number of OPC modules and any number of OPC modules may be included depending on the application of IC package 201. In some embodiments, such as that depicted in FIG. 1, no OPC modules may be utilized.

Frame 202 may be configured to be coupled with package substrate 206 by way of surface S2 of frame 202 and surface S3 of package substrate 206. In embodiments, the area of surface S3 may be defined by the various dimensions of the components coupled with package substrate 206, and frame 202 may be designed accordingly. As depicted, surface S2 may be disposed opposite surface S1. In embodiments, frame 202 may be coupled with IC package 201 through any manner of traditional coupling mechanisms, such as, for example, any type of adhesive.

Figure 3:
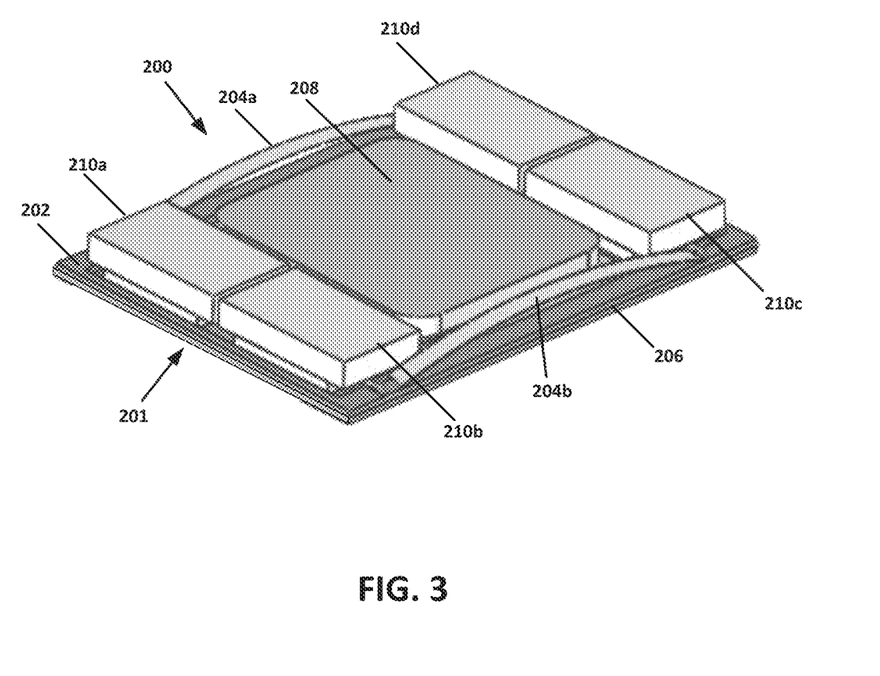
FIG. 3 is a perspective view of an IC package coupled with a package load assembly, in accordance with various embodiments of the present disclosure.

FIG. 3 is another view of IC package 201 of FIG. 2 coupled with package load assembly 200 of FIG. 2, in accordance with various embodiments of the present disclosure. As discussed above, IC package 201 may include package substrate 206. IC package 201 may also include one or more dies (e.g., die 402 of FIG. 4) coupled with the die attachment area of package substrate 206 depicted here by IHS 208. IHS 208 may be disposed over the one or more dies coupled with the die attachment area in a similar configuration to that depicted by IHS 104 of FIG. 1. IC package 201 may include one or more components coupled with package substrate 206. Such components may include on-package-component (OPC) modules 210a-210d In addition, package load assembly 200 may include a frame 202 with deformable members 204a and 204b disposed on a surface of the frame.

In embodiments, frame 202 of package load assembly 200 may increase the rigidity of package substrate 206. In addition, package load assembly 200 may enable a force, or load, of a heat sink (e.g., heat sink 102 of FIG. 1 and 502 of FIGS. 5 and 6) to be distributed to package substrate 206. This increase in rigidity and distribution of force may enable a size of IHS 208 to be reduced compared to an embodiment where such a package load assembly is not present. This reduction in size may reduce the cost of implementing IHS 208 in addition to opening up areas of package substrate 206 for the placement of additional components, such as OPC modules 210a-d, within the perimeter of frame 202.

Figure 4:
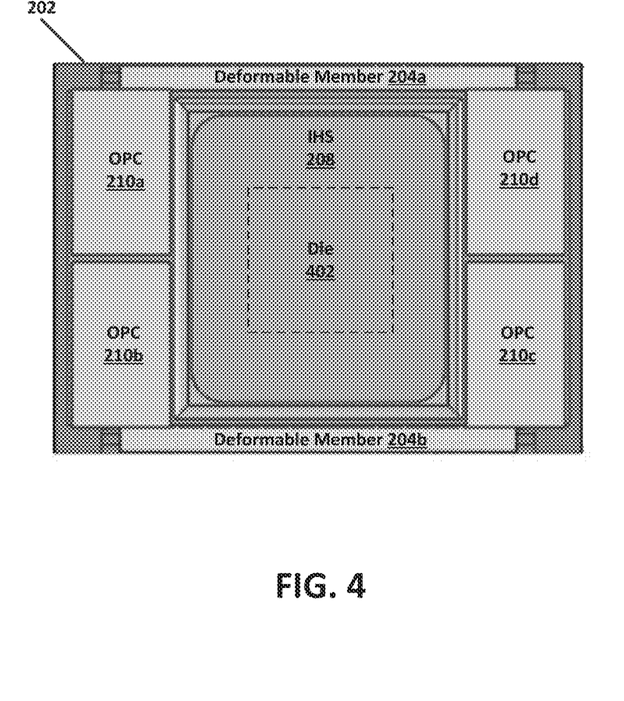
FIG. 4 is a top-down view of an IC package coupled with a package load assembly, in accordance with various embodiments of the present disclosure.

FIG. 4 is a top-down view of IC package 201 of FIGS. 2 and 3 coupled with package load assembly 200 of FIGS. 2 and 3, in accordance with various embodiments of the present disclosure. As discussed above, the IC package 201 may include package substrate 206. IC package 201 may also include one or more dies (e.g., die 402) coupled with the die attachment area of package substrate 206, discussed above and encompassed by IHS 208. IHS 208 may be disposed over the one or more dies coupled with the die attachment area in a similar configuration to that depicted by IHS 104 of FIG. 1. IC package 201 may include one or more additional components coupled with package substrate 206. Such additional components may include on-package-component (OPC) modules 210a-210d. In addition, the package load assembly 200 may include frame 202 with deformable members 204a and 204b disposed on a surface of the frame.

Frame 202 may be configured to form a perimeter around the die attachment area of the IC package. In some embodiments, frame 202 may also form a perimeter around one or more additional components, such as OPC modules 210a-210d. As discussed above, frame 202 may increase the rigidity of the IC package to enable a size of IHS 208 to be reduced compared to an embodiment where such a package load assembly is not present. This reduction in size may open up the areas in which OPC modules 210a-210d are disposed in addition to reducing the cost associated with production of IHS 208.

Figure 9:
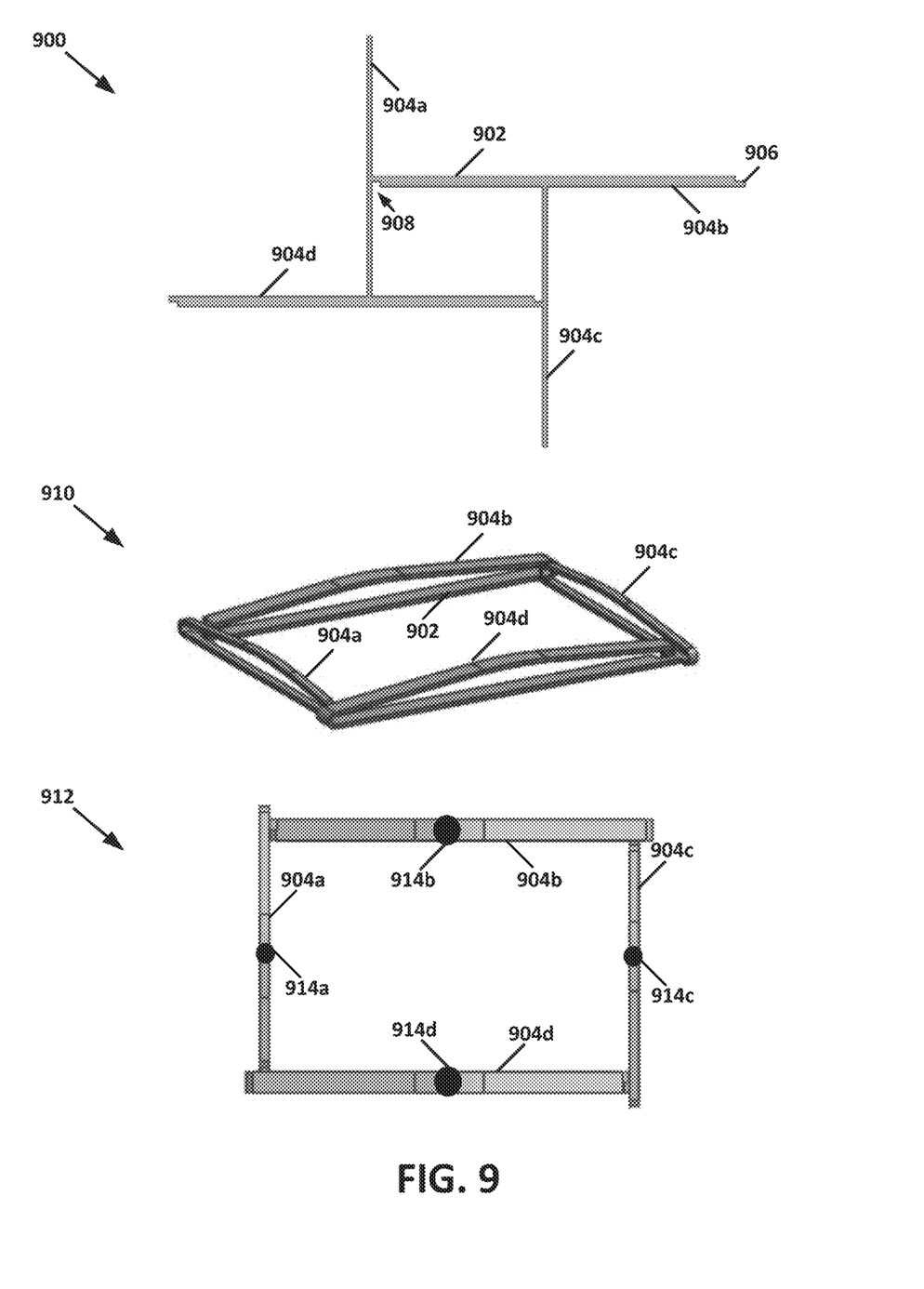
FIG. 9 provides various views of yet another package load assembly having deformable members integrated therewith, in accordance with various embodiments of the present disclosure.

As depicted, deformable members 204a and 204b may be disposed in positions on opposite sides of frame 202. This positioning may enable balanced distribution of the force, or load, of a heat sink, such as heat sink 102 of FIG. 1 or heat sink 502 of FIG. 5 or 6, to the package substrate. While depicted as only two deformable members, any number of deformable members may be disposed on frame 202 without departing from the scope of this disclosure. For example, in some embodiments, additional deformable members may be positioned to run along the portion of frame 202 located along-side OPC modules 210a and 210b and the portion of frame 202 located along-side OPC modules 210c and 210d. Such a package load assembly is depicted in FIG. 9, below.

Figure 6:
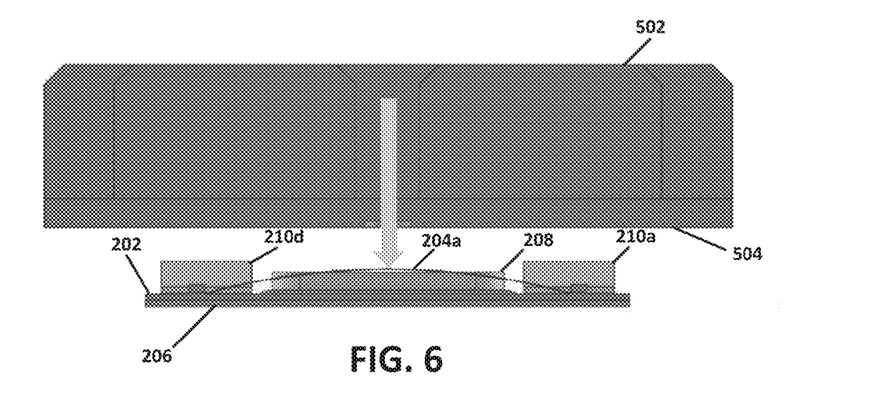
FIG. 6 provides a profile view of FIG. 5, in accordance with various embodiments of the present disclosure.

FIG. 5 is an exploded view of an IC package coupled with a package load assembly, as described above in reference to FIGS. 2-4, and a heat sink 502, in accordance with various embodiments of the present disclosure. As can be seen, heat sink 502 may be configured with an alignment notch 508 to position heat sink 502 onto deformable member 204b. A corresponding alignment notch, not able to be seen in the present view, may also be disposed on an opposite side of heat sink 502 to position heat sink 502 onto deformable member 204a. Deformable members 204a and 204b may be configured to distribute a force applied between heat sink 502 and package substrate 206, via frame 202, and to deform under the force to allow a base 504 of heat sink 502 to couple with a surface of IHS 208. In some embodiments, the base 504 of heat sink 502 may have one or more alignment holes (e.g., alignment hole 506) formed therein. Each of these alignment holes may be configured to accept a pin integrated with a circuit board (e.g., pin 126 and circuit board 124 of FIG. 1). As discussed above in reference to FIG. 1, such pins may be utilized to position heat sink 502 onto the load frame. In addition, such pins may be threaded to accept a threaded fastener to secure heat sink 502 to the circuit board. In some embodiments, these fasteners may be spring loaded to allow for adjustment of the force between heat sink 502 and package substrate 206. FIG. 6 provides a profile view of FIG. 5, in accordance with various embodiments of the present disclosure. As can be seen, OPC modules 210a and 210d may protrude above the surface of IHS 208 that is to contact heat sink base 504. In such configurations, a portion of the heat sink base above the protruding OPC modules may be removed to enable base 504 to contact the surface of IHS 208.

Figure 7:
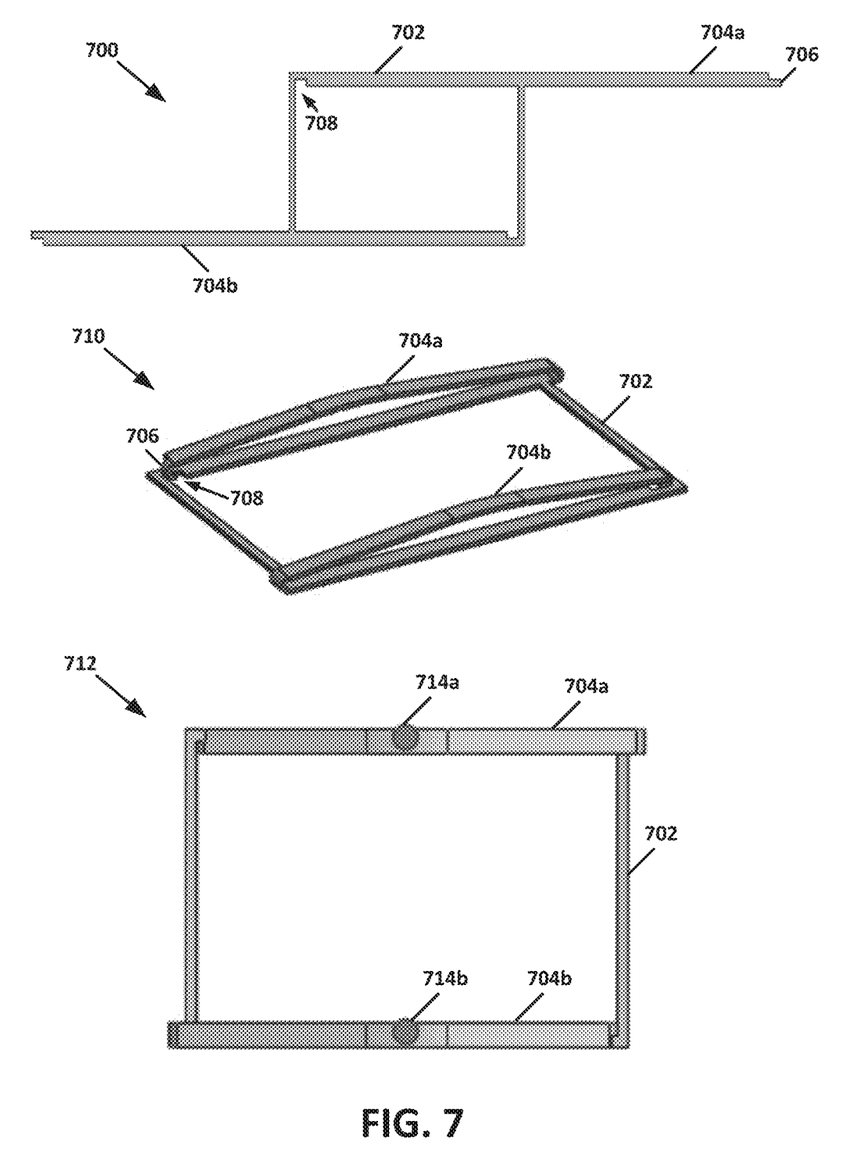
FIG. 7 provides various views of a package load assembly having deformable members integrated therewith, in accordance with various embodiments of the present disclosure.

FIG. 7 provides various stages and views of a package load assembly having deformable members 704a and 704b integrated with a frame 702, in accordance with various embodiments of the present disclosure. As can be seen at 700, the package load assembly may be formed from a single piece of material. This may be accomplished by stamping or otherwise forming the single sheet of material to form a frame 702 having deformable members 704a and 704b, which have not yet been formed at 700, integrated therewith. In some embodiments, deformable members may have tabs (e.g., tab 706) formed on a terminal end of the deformable members and the frame may have tab notches (e.g., tab notch 708) in which the tabs may align once the deformable members have been formed.

At 710, deformable members 704a and 704b have been formed into a leaf spring structure. This may be accomplished by bending, or otherwise manipulating, deformable members 704a and 704b to form leaf springs over frame 702. As can be seen, tab 706 of deformable member 704a aligns with tab notch 708 of frame 702.

At 712 a top-down view of the package load assembly is depicted. As can be seen, the package load assembly has deformable members 704a and 704b having contact points 714a and 714b, respectively, for contacting a base surface of a heat sink (e.g., heat sink 102 of FIG. 1 or heat sink 502 of FIGS. 5 and 6). These contact points along with deformable members 704a and 704b and frame 702 may enable a force of the heat sink to be distributed to an IC package substrate (e.g., package substrate 116 of FIG. 1 or package substrate 206 of FIGS. 2-6).

Figure 8:
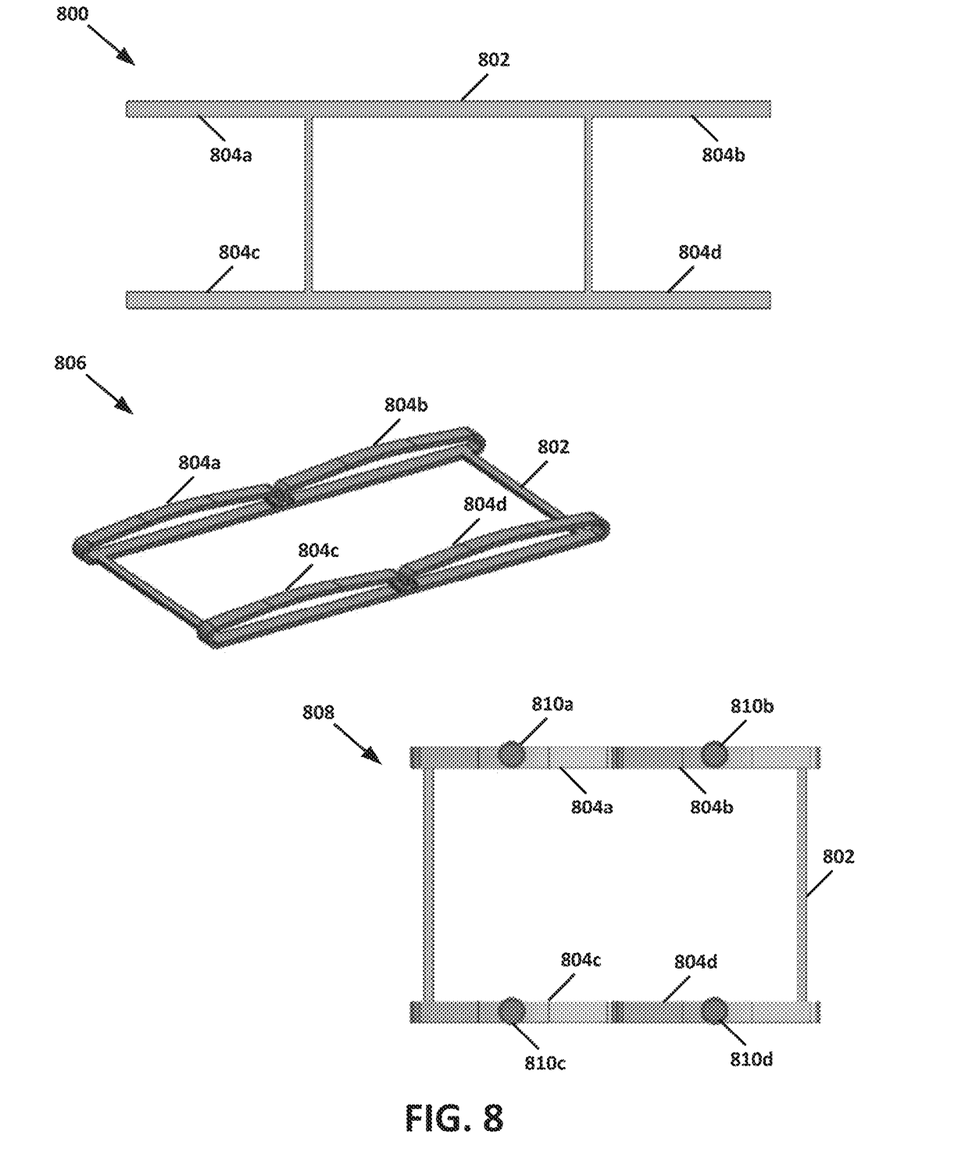
FIG. 8 provides various views of another package load assembly having deformable members integrated therewith, in accordance with various embodiments of the present disclosure.

FIG. 8 provides various views of another package load assembly having deformable members integrated therewith, in accordance with various embodiments of the present disclosure. As can be seen at 800, the package load assembly may, in some embodiments, be formed from a single piece of material. This may be accomplished by stamping or otherwise forming the single sheet of material to form a frame 802 having deformable members 804a-804d, which have not yet been formed at 800, integrated therewith.

At 806, deformable members 804a-804d have been formed into a leaf spring structures. This may be accomplished by bending, or otherwise manipulating, deformable members 804a-804d to form leaf springs over frame 802.

At 808 a top-down view of the package load assembly is depicted. As can be seen, the package load assembly has deformable members 804a-804d having contact points 810a-810d, respectively, for contacting a base surface of a heat sink (e.g., heat sink 102 of FIG. 1 or heat sink 502 of FIGS. 5 and 6). These contact points along with deformable members 804a-804d and frame 802 may enable a force of the heat sink to be distributed to an IC package substrate (e.g., package substrate 116 of FIG. 1 or package substrate 206 of FIGS. 2-6).

FIG. 9 provides various views of yet another package load assembly having deformable members integrated therewith, in accordance with various embodiments of the present disclosure. As can be seen at 900, the package load assembly may, in some embodiments, be formed from a single piece of material. This may be accomplished by stamping or otherwise forming the single sheet of material to form a frame 902 having deformable members 904a-904d, which have not yet been formed at 900, integrated therewith.

At 910, deformable members 904a-904d have been formed into a leaf spring structures along the four sides of frame 902. This may be accomplished by bending deformable members 904a-904d to form leaf springs over frame 902.

At 912 a top-down view of the package load assembly is depicted. As can be seen, the package load assembly has deformable members 904a-904d having contact points, 914a-914d, respectively, configured to contact a base surface of a heat sink (e.g., heat sink 102 of FIG. 1 or heat sink 502 of FIGS. 5 and 6). These contact points along with deformable members 914a-914d and frame 902, may enable a force of the heat sink to be distributed to an IC package substrate (e.g., package substrate 116 of FIG. 1 or package substrate 206 of FIGS. 2-6).

Figure 10:
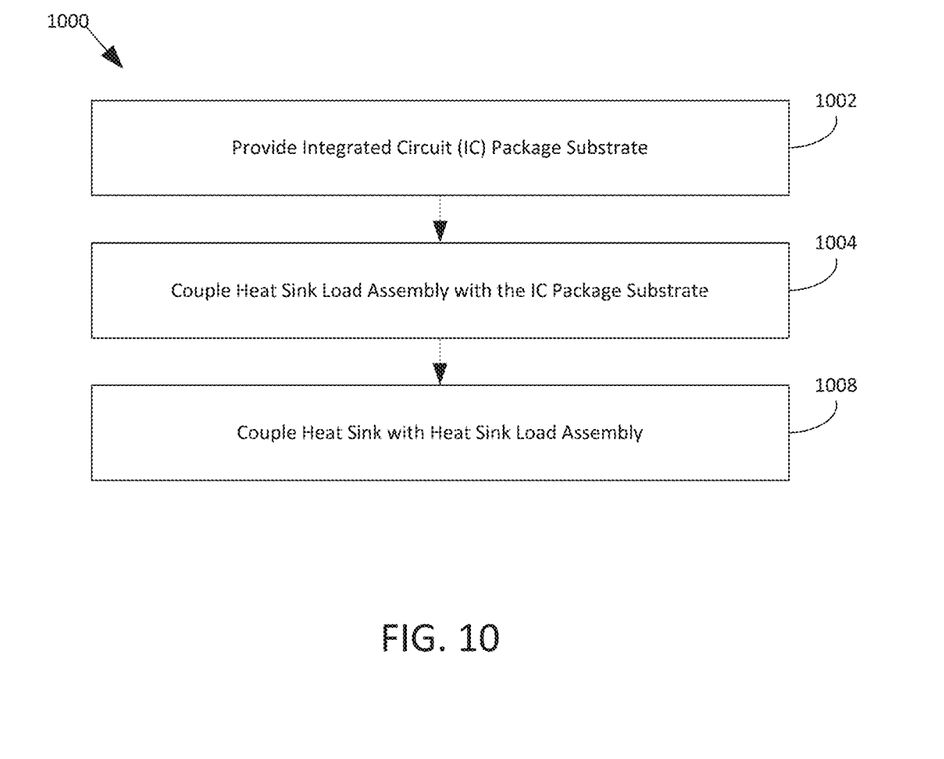
FIG. 10 is a flow chart depicting an illustrative method of assembling an IC package assembly, according to some embodiments of the present disclosure.

FIG. 10 is a flow chart depicting an illustrative method 1000 of assembling an IC package assembly (e.g., IC package assembly 100 of FIG. 1), according to some embodiments of the present disclosure. The process may begin at block 1002 where an integrated circuit package substrate (e.g., package substrate 116 of FIG. 1 or package substrate 206 of FIGS. 2-6) may be provided. At 1004 a package load assembly, such as that described elsewhere herein, may be coupled with the IC package substrate. This may be accomplished through any typical coupling means, such as adhesive, retention clips, or any other suitable mechanism.

At block 1008, a heat sink (e.g., heat sink 102 of FIG. 1 or heat sink 502 of FIG. 5 or 6) may be coupled with the load frame. Again, this may be accomplished through any typical coupling means. In some embodiments, a base of the heat sink may have one or more alignment holes (e.g., alignment hole 506 of FIG. 5) formed therein. Each of these alignment holes may be configured to accept a pin integrated with a circuit board (e.g., circuit board 124 of FIG. 1). Such pins may be utilized to position the heat sink onto the load frame. In addition, such pins may be threaded to accept a threaded fastener to secure the heat sink to the circuit board. In some embodiments, these fasteners may be spring loaded to allow for adjustment of the force between the heat sink and the package substrate.

Figure 11:
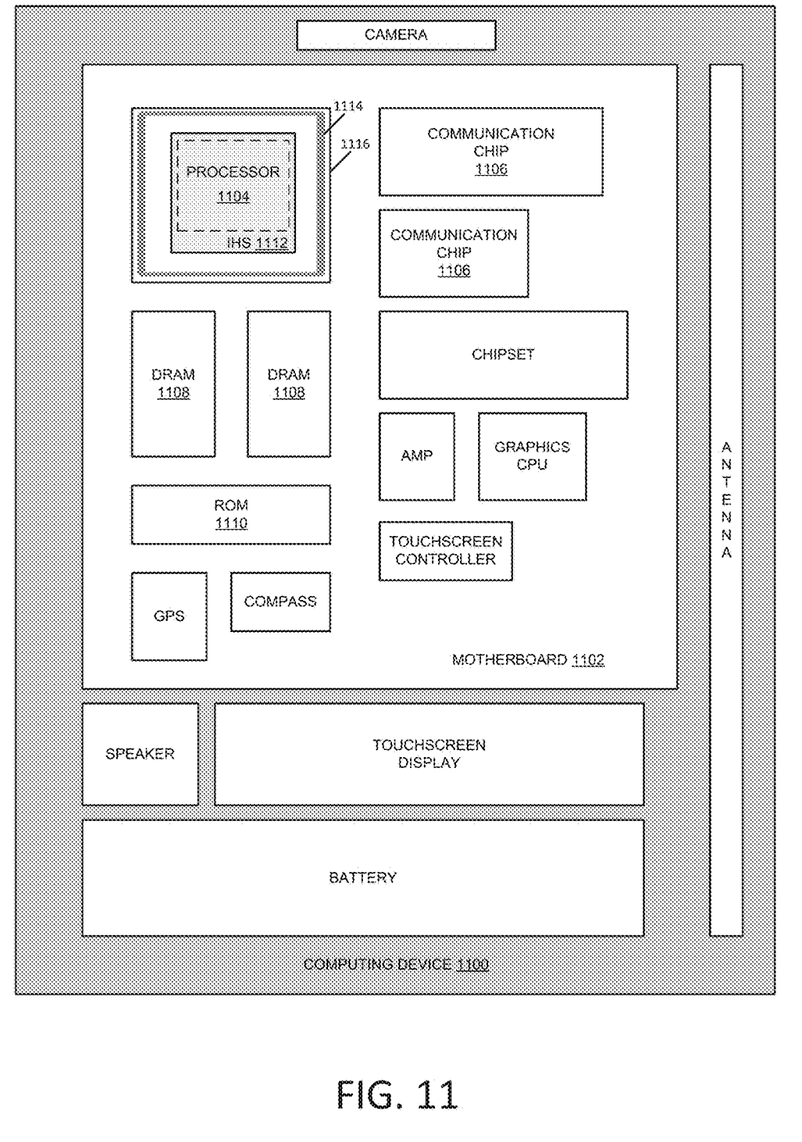
FIG. 11 schematically illustrates a computing device that includes a package substrate having a package load assembly, in accordance with various embodiments of the present disclosure.

Embodiments of the present disclosure may be implemented into a system using any suitable hardware and/or software to configure as desired. FIG. 11 schematically illustrates a computing device, in accordance with some embodiments. The computing device 1100 may house a board such as motherboard 1102. The motherboard 1102 may include a number of components, including but not limited to a processor 1104 and at least one communication chip 1106. The processor 1104 may be physically and electrically coupled with the motherboard 1102. In embodiments, motherboard 1102 may also include an integrated heat spreader (IHS) 1112, and a package load assembly 1114, such as that discussed above, coupled with a package substrate 1116, such as that discussed above. In some implementations, the at least one communication chip 1106 may also be physically and electrically coupled to the motherboard 1102. In further implementations, the communication chip 1106 may be part of the processor 1104.

Depending on its applications, computing device 1100 may include other components that may or may not be physically and electrically coupled to the motherboard 1102. These other components may include, but are not limited to, volatile memory (e.g., dynamic random access memory (DRAM) 1108), non-volatile memory (e.g., read-only memory (ROM) 1110), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1106 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other embodiments.

The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, EV-DO, and others.

The processor 1104 of the computing device 1100 may be packaged in an IC assembly (e.g., IC assembly 100 of FIG. 1) that includes a package substrate 1116 as described herein. For example, the circuit board 124 of FIG. 1 may be a motherboard 1102 and the processor 1104 may be a die 106 mounted on package substrate 1116, which may be package substrate 116 as described herein. Package substrate 1116 and motherboard 1102 may be coupled together using package-level interconnects as described herein. The term "processor" may refer to any device or portion of a device that processes electronic data from registers and/or memory to transform that electronic data into other electronic data that may be stored in registers and/or memory.

The communication chip 1106 may also include a die (e.g., die 106 of FIG. 1) that may be packaged in an IC assembly (e.g., IC assembly 100 of FIG. 1) that includes a package substrate 116 coupled with a package load assembly as described herein. In further implementations, another component (e.g., memory device or other integrated circuit device) housed within the computing device 1100 may include a die (e.g., die 106 of FIG. 1) that may be packaged in an IC assembly (e.g., IC assembly 100 of FIG. 1) that includes a package substrate 116 coupled with a package load assembly as described herein.

In addition, computing device 1100 may include one or more computer-readable media, such as DRAM 1108 or ROM 1110. In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

EXAMPLES

According to various embodiments, the present disclosure describes a number of examples. Example 1 is an apparatus comprising: a frame configured to form a perimeter around a die area of a package substrate and having a first surface configured to be coupled with a surface of the package substrate and a second surface disposed opposite to the first surface; and a plurality of deformable members disposed on the second surface of the frame, the plurality of deformable members configured to be coupled with a base of a heat sink to distribute a force applied between the heat sink and the package substrate, via the frame, and deform under application of the force to allow the base of the heat sink to contact a surface of an integrated heat spreader within the die area of the package substrate.

Example 2 may include the subject matter of Example 1, wherein the frame is further configured to increase a rigidity of the package substrate when coupled with the surface of the package substrate.

Example 3 may include the subject matter of either of Examples 1 or 2, wherein the deformable members are detachable from the frame to enable an exchange of one deformable member of the plurality of deformable members for a different deformable member.

Example 4 may include the subject matter of any one of Examples 1-3, wherein the frame is substantially rectangular in shape, and wherein a first subset of the plurality of deformable members is disposed on a first side of the frame and a second subset of the plurality of deformable members is disposed on a second side of the frame, the second side disposed opposite to the first side of the frame.

Example 5 may include the subject matter of Example 4, wherein a third subset of the plurality of deformable members is disposed on a third side of the frame and a fourth subset of the plurality of deformable members is disposed on a fourth side of the frame, the fourth side disposed opposite to the third side of the frame.

Example 6 may include the subject matter of any one of Examples 1-5, wherein the frame is further configured to form a perimeter around one or more on-package-component (OPC) keep out zones of the package substrate.

Example 7 may include the subject matter of any one of Examples 1-5, wherein the plurality of deformable members comprise a plurality of springs.

Example 8 may include the subject matter of Example 7, wherein the plurality of springs are leaf springs.

Example 9 may include the subject matter of either of Examples 7 or 8, wherein the plurality of springs are constructed from one or both of metal or plastic.

Example 10 may include the subject matter of any one of Examples 7-9, wherein the frame and the deformable members are formed from a single sheet of material.

Example 11 is a package assembly comprising: a package substrate having an integrated circuit (IC) die disposed thereon; an integrated heat spreader (IHS) coupled with the IC die to transfer thermal energy away from the IC die; a heat sink coupled with a surface of the IHS to transfer thermal energy away from the IHS; and a frame configured to form a perimeter around the IHS, the frame having a first surface coupled with a surface of the package substrate, and a plurality of deformable members disposed on a second surface of the frame, the second surface disposed opposite the first surface, the plurality of deformable members configured to distribute a force applied between the heat sink and the package substrate, via the frame, and to deform under the force to allow a base of the heat sink to couple with the surface of the IHS.

Example 12 may include the subject matter of Example 11, wherein the frame is further configured to increase a rigidity of the package substrate.

Example 13 may include the subject matter of either of Examples 11 or 12, wherein the deformable members are detachable from the frame to enable an exchange of one deformable member of the plurality of deformable members for a different deformable member.

Example 14 may include the subject matter of any one of Examples 11-13, wherein the frame is substantially rectangular in shape, and wherein a first subset of the plurality of deformable members is disposed on a first side of the frame and a second subset of the plurality of deformable members is disposed on a second side of the frame, the second side disposed opposite to the first side of the frame.

Example 15 may include the subject matter of Example 14, wherein a third subset of the plurality of deformable members is disposed on a third side of the frame and a fourth subset of the plurality of deformable members is disposed on a fourth side of the frame, the fourth side disposed opposite to the third side of the frame.

Example 16 may include the subject matter of any one of Examples 11-15, wherein the package substrate includes one or more on-package-component (OPC) modules disposed thereon and wherein the frame is further configured to form a perimeter around the one or more OPC modules.

Example 17 may include the subject matter of any one of Examples 11-16, wherein the plurality of deformable members comprise a plurality of springs.

Example 18 may include the subject matter of Example 17, wherein the plurality of springs are leaf springs.

Example 19 may include the subject matter of either of Examples 17 or 18, wherein the plurality of springs are constructed from one or both of metal or plastic.

Example 20 may include the subject matter of any one of Examples 17-19, wherein the frame and the deformable members are formed from a single sheet of material.

Example 21 is a method of forming a package assembly comprising: providing an integrated circuit (IC) package substrate having an IC die and an integrated heat spreader IHS disposed thereon; coupling a package load assembly with the IC package substrate, wherein the package load assembly includes: a frame forming a perimeter around the IHS, and a plurality of deformable members disposed on a surface of the frame; and coupling a heat sink to the package load assembly, wherein the plurality of deformable members distribute a force applied between the heat sink and the IC package substrate and deform under the force to allow a base of the heat sink to couple with a surface of the IHS.

Example 22 may include the subject matter of Example 21, wherein coupling the package load assembly with the IC package substrate further comprises applying an adhesive to either a first surface of the IC package substrate or a second surface of the package load assembly.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read-only-memory (CD-ROM), compact disk-read/write (CD-R/W), and DVD.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
   a frame to form a perimeter around a die area of a package substrate, a first surface of the frame to contact a surface of the package substrate around an entirety of the perimeter formed around the die area; and
   a plurality of deformable members disposed on a second surface of the frame, the second surface disposed opposite to the first surface, the plurality of deformable members to be coupled with a base of a heat sink to distribute a force applied between the heat sink and the package substrate, via the frame, and deform under application of the force to allow the base of the heat sink to contact a surface of an integrated heat spreader within the die area of the package substrate.

2. The apparatus of claim 1, wherein the frame is further configured to increase a rigidity of the package substrate when in contact with the surface of the package substrate.

3. The apparatus of claim 1, wherein the deformable members are detachable from the frame to enable an exchange of one deformable member of the plurality of deformable members for a different deformable member.

4. The apparatus of claim 1, wherein the frame is substantially rectangular in shape, and wherein a first subset of the plurality of deformable members is disposed on a first side of the frame and a second subset of the plurality of deformable members is disposed on a second side of the frame, the second side disposed opposite to the first side of the frame.

5. The apparatus of claim 4, wherein a third subset of the plurality of deformable members is disposed on a third side of the frame and a fourth subset of the plurality of deformable members is disposed on a fourth side of the frame, the fourth side disposed opposite to the third side of the frame.

6. The apparatus of claim 1, wherein the perimeter further is formed around one or more on-package-component (OPC) keep out zones of the package substrate.

7. The apparatus of claim 1, wherein the plurality of deformable members comprise a plurality of springs.

8. The apparatus of claim 7, wherein the plurality of springs are leaf springs.

9. The apparatus of claim 7, wherein the plurality of springs are constructed from one or both of metal or plastic.

10. The apparatus of claim 7, wherein the frame and the deformable members are formed from a single sheet of material.

11. A package assembly comprising:
    a package substrate with an integrated circuit (IC) die and one or more on-package-component (OPC) modules disposed thereon;
    an integrated heat spreader (IHS) coupled with the IC die to transfer thermal energy away from the IC die;
    a heat sink coupled with a surface of the IHS to transfer thermal energy away from the IHS;
    a frame to form a perimeter around the IHS and the one or more OPC modules, a first surface of the frame coupled with a surface of the package substrate; and
    a plurality of deformable members disposed on a second surface of the frame, the second surface disposed opposite to the first surface, the plurality of deformable members to distribute a force applied between the heat sink and the package substrate, via the frame, and to deform under the force to allow a base of the heat sink to couple with the surface of the IHS.

12. The package assembly of claim 11, wherein the frame is further configured to increase a rigidity of the package substrate.

13. The apparatus of claim 11, wherein the deformable members are detachable from the frame to enable an exchange of one deformable member of the plurality of deformable members for a different deformable member.

14. The package assembly of claim 11, wherein the frame is substantially rectangular in shape, and wherein a first subset of the plurality of deformable members is disposed on a first side of the frame and a second subset of the plurality of deformable members is disposed on a second side of the frame, the second side disposed opposite to the first side of the frame.

15. The package assembly of claim 14, wherein a third subset of the plurality of deformable members is disposed on a third side of the frame and a fourth subset of the plurality of deformable members is disposed on a fourth side of the frame, the fourth side disposed opposite to the third side of the frame.

16. The package assembly of claim 11, wherein the plurality of deformable members comprise a plurality of springs.

17. The package assembly of claim 16, wherein the plurality of springs are leaf springs.

18. The package assembly of claim 16, wherein the plurality of springs are constructed from one or both of metal or plastic.

19. The package assembly of claim 16, wherein the frame and the deformable members are formed from a single sheet of material.

20. A method of forming a package assembly comprising:
    providing an integrated circuit (IC) package substrate having an IC die, an integrated heat spreader (IHS), and one or more on-package-component (OPC) modules disposed thereon;

coupling a package load assembly with the IC package substrate, wherein the package load assembly includes:
a frame forming a perimeter around the IHS and the one or more OPC modules; and
a plurality of deformable members disposed on a surface of the frame; and
coupling a heat sink to the package load assembly, wherein the plurality of deformable members distribute a force applied between the heat sink and the IC package substrate and deform under the force to allow a base of the heat sink to couple with a surface of the IHS.

21. The method of claim 20, wherein coupling the package load assembly with the IC package substrate further comprises applying an adhesive to either a surface of the IC package substrate or a second surface of the frame, the second surface of the frame disposed opposite to the surface of the frame.

* * * * *